(12) United States Patent
Xu

(10) Patent No.: US 9,612,497 B2
(45) Date of Patent: Apr. 4, 2017

(54) ARRAY SUBSTRATE AND MANUFACTURING METHOD THEREOF AND LIQUID CRYSTAL DISPLAY PANEL USING THE ARRAY SUBSTRATE

(71) Applicant: Shenzhen China Star Optoelectronics Technology Co. Ltd., Shenzhen, Guangdong (CN)

(72) Inventor: Xiangyang Xu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 468 days.

(21) Appl. No.: 14/236,867

(22) PCT Filed: Dec. 31, 2013

(86) PCT No.: PCT/CN2013/091251
§ 371 (c)(1),
(2) Date: Feb. 3, 2014

(87) PCT Pub. No.: WO2015/085641
PCT Pub. Date: Jun. 18, 2015

(65) Prior Publication Data
US 2016/0195745 A1 Jul. 7, 2016

(30) Foreign Application Priority Data

Dec. 10, 2013 (CN) .......................... 2013 1 0670010

(51) Int. Cl.
*G02F 1/136* (2006.01)
*G02F 1/1368* (2006.01)
(Continued)

(52) U.S. Cl.
CPC .......... *G02F 1/1368* (2013.01); *G02F 1/1339* (2013.01); *G02F 1/133512* (2013.01);
(Continued)

(58) Field of Classification Search
CPC ............. G02F 1/1368; G02F 1/133512; G02F 1/133514; G02F 1/1339; G02F 1/136286;
(Continued)

(56) References Cited

U.S. PATENT DOCUMENTS

2002/0101557 A1* 8/2002 Ono .................. G02F 1/134363
349/143
2004/0070718 A1* 4/2004 Saigo ................ G02F 1/136227
349/141
(Continued)

FOREIGN PATENT DOCUMENTS

CN 1987983 A 6/2007
CN 101419368 A 4/2009
(Continued)

*Primary Examiner* — James Dudek
(74) *Attorney, Agent, or Firm* — Andrew C. Cheng

(57) ABSTRACT

The present invention provides an array substrate and a manufacturing method thereof and a liquid crystal display panel using the array substrate. The array substrate includes: a first substrate (32), a gate line formed on the first substrate (32), a data line (34) formed on the first substrate (32), a thin-film transistor array formed on the first substrate (32), a pixel electrode (36) formed on the thin-film transistor array, a first passivation layer (38) formed on the pixel electrode (36), the data line (34), and the thin-film transistor array, a black matrix (42) formed on the first passivation layer (38), and a common electrode (44) formed on the black matrix (42) and the first passivation layer (38). The present invention arranges the black matrix formed on the array substrate to reduce the parasitic capacitance between the common electrode and the gate line and the data line so as to help enhance uniformity of voltage on the common electrode.

6 Claims, 11 Drawing Sheets

(51) Int. Cl.
*H01L 29/786* (2006.01)
*H01L 27/12* (2006.01)
*G02F 1/1362* (2006.01)
*G02F 1/1335* (2006.01)
*G02F 1/1339* (2006.01)
*H01L 21/02* (2006.01)
*H01L 21/027* (2006.01)
*H01L 29/423* (2006.01)
*H01L 29/49* (2006.01)
*H01L 29/66* (2006.01)

(52) U.S. Cl.
CPC .. *G02F 1/133514* (2013.01); *G02F 1/136209* (2013.01); *G02F 1/136286* (2013.01); *H01L 21/0262* (2013.01); *H01L 21/0274* (2013.01); *H01L 21/02274* (2013.01); *H01L 21/02532* (2013.01); *H01L 21/02592* (2013.01); *H01L 27/124* (2013.01); *H01L 27/1218* (2013.01); *H01L 27/1222* (2013.01); *H01L 27/1259* (2013.01); *H01L 29/42364* (2013.01); *H01L 29/42372* (2013.01); *H01L 29/495* (2013.01); *H01L 29/4908* (2013.01); *H01L 29/66765* (2013.01); *H01L 29/78633* (2013.01); *H01L 29/78669* (2013.01); *G02F 2001/13606* (2013.01); *G02F 2001/136295* (2013.01)

(58) Field of Classification Search
CPC ......... H01L 21/02274; H01L 21/02532; H01L 21/02592; H01L 21/0262; H01L 21/0274; H01L 27/1218; H01L 27/1222; H01L 27/124; H01L 27/1259; H01L 29/42364; H01L 29/42372; H01L 29/4908; H01L 29/495; H01L 29/66765; H01L 29/78669
See application file for complete search history.

(56) References Cited

U.S. PATENT DOCUMENTS

| | | | |
|---|---|---|---|
| 2008/0002127 | A1 | 1/2008 | Nam et al. |
| 2012/0248446 | A1* | 10/2012 | Liu ............... H01L 29/78618 257/59 |
| 2014/0118673 | A1* | 5/2014 | Park ............... G02F 1/133345 349/138 |

FOREIGN PATENT DOCUMENTS

| | | |
|---|---|---|
| CN | 101614915 A | 12/2009 |
| CN | 101995709 A | 3/2011 |
| CN | 102012590 A | 4/2011 |
| CN | 102023430 A | 4/2011 |

* cited by examiner

ARRAY SUBSTRATE AND MANUFACTURING METHOD THEREOF AND LIQUID CRYSTAL DISPLAY PANEL USING THE ARRAY SUBSTRATE

BACKGROUND OF THE INVENTION

1. Field of the Invention

The present invention relates to the field of liquid crystal display technology, and in particular to an array substrate and a manufacturing method thereof and a display panel using the array substrate.

2. The Related Arts

Liquid crystal displays (LCDs) have a variety of advantages, such as thin device body, low power consumption, and being free of radiation, and are thus widely used. The development of the liquid crystal display industry brings in severer and severer performance requirements, such as performance related to high resolution, high brightness, wide view angle, and low power consumption, and associated techniques have been developed. Most of the liquid crystal displays that are currently available in the market are backlighting liquid crystal displays, which comprise a liquid crystal display panel and a backlight module. The operation principle of the liquid crystal display panel is that, with liquid crystal molecules interposed between two parallel glass substrates, application of electricity is selectively carried out to control the liquid crystal molecules to change direction in order to refract out light emitting from the backlight module for generating images.

The liquid crystal display panel comprises a color filter (CF) substrate, a thin-film transistor (TFT) substrate, liquid crystal (LC) interposed between the CF substrate and the TFT substrate, and a sealant and the manufacturing process generally comprises: a front stage of array process (including thin film, yellow light, etching, and film stripping), an intermediate stage of cell process (including laminating the TFT substrate and the CF substrate), and a rear stage of assembling process (including mounting of drive ICs and printed circuit board).

The liquid crystal display panels that are available in the mainstream market can be classified in three categories, including TN (twisted nematic)/STN (super twisted nematic), IPS (in-plane switching)/FFS (fringe field switching), and VA (Vertical Alignment). The FFS display panel is superior to the TN display panel in respect of view angle and is superior to the IPS display panel in respect of liquid crystal transmittance efficiency and thus, besides applications thereof in small-sized devices, is also getting a wider and wider applications medium- and large-sized monitors and televisions.

An FFS display panel uses a fringe electric field between a common electrode and a pixel electrode to drive liquid crystal. To eliminate after images caused by residues of direct current, it is a common practice to use an alternate current mode for driving. Such an alternate current is achieved with a voltage applied to the common electrode. Thus, the uniformity of the voltage on the common electrode directly affect the displaying quality of images. When the voltage of the common electrode is not uniform, the images on the screen may show phenomena of being greenish and flickering.

SUMMARY OF THE INVENTION

An object of the present invention is to provide an array substrate, which takes advantage of a black matrix formed thereon to reduce a parasitic capacitance between a common electrode and gate lines and data lines in order to help enhance uniformity of voltage on the common electrode and improve the phenomena of being greenish and flickering of an image on a screen.

Another object of the present invention is to provide a manufacturing method of an array substrate, which enables easy and efficient manufacture and an array substrate manufactured with such a method helps improve the displaying quality of a liquid crystal display panel.

A further object of the present invention is to provide a liquid crystal display panel, which comprises a black matrix formed on an array substrate in order to reduce a parasitic capacitance between a common electrode and gate lines and data lines to help enhance uniformity of voltage on the common electrode and improve the phenomena of being greenish and flickering of an image on a screen.

To achieve the above objects, the present invention provides an array substrate, which comprises: a first substrate, a gate line formed on the first substrate, a data line formed on the first substrate, a thin-film transistor array formed on the first substrate, a pixel electrode formed on the thin-film transistor array, a first passivation layer formed on the pixel electrode, the data line, and the thin-film transistor array, a black matrix formed on the first passivation layer, and a common electrode formed on the black matrix and the first passivation layer.

The thin-film transistor array comprises: a gate terminal formed on the first substrate, a gate insulation layer formed on the first substrate and the gate terminal, a semiconductor layer formed on the gate insulation layer, and a source/drain terminal formed on the semiconductor layer. The gate terminal is made of a metal of chromium, molybdenum, aluminum, or copper. The gate insulation layer is formed by depositing silicon through plasma enhanced chemical vapor deposition. The semiconductor layer is formed by depositing hydrogenated amorphous silicon.

The pixel electrode and the common electrode are each a transparent conductive layer. The pixel electrode and the common electrode are both made of indium tin oxide or indium zinc oxide. The first substrate is a glass substrate or a plastic substrate.

The gate insulation layer has a thickness of 2000-5000 Å. The gate terminal has a thickness of 2000-5000 Å. The semiconductor layer has a thickness of 2000-4000 Å. The first passivation layer has a thickness of 100-6000 Å. The source/drain terminal has a thickness of 1000-6000 Å. The pixel electrode has a thickness of 100-1000 Å. The common electrode has a thickness of 100-1000 Å. The black matrix has a thickness of 0.2-1.0 um.

The present invention also provides a manufacturing method of an array substrate, which comprising the following steps:

(1) providing a first substrate;

(2) forming a gate line, a data line, and a thin-film transistor array on the first substrate;

(3) forming a pixel electrode on the thin-film transistor array;

(4) depositing and forming a first passivation layer on the pixel electrode, the data line, and the thin-film transistor array;

(5) forming a black matrix on the first passivation layer; and (6) forming a common electrode on the black matrix and the first passivation layer.

Step (2) comprises the following steps:

(2.1) forming a first metal layer on the first substrate and subjecting the first metal layer to a first photolithographic process according to a predetermined pattern to form a gate terminal and the gate line;

(2.2) applying plasma enhanced chemical vapor deposition to deposit silicon on the first substrate and the gate terminal and the gate line to form a gate insulation layer;

(2.3) applying plasma enhanced chemical vapor deposition to deposit hydrogenated amorphous silicon on the gate insulation layer to form a semiconductor layer and subjecting the semiconductor layer 56 to a second photolithographic process according to a predetermined pattern; and (2.4) forming a second metal layer on the semiconductor layer and the gate insulation layer and subjecting the second metal layer to a third photolithographic process according to a predetermined pattern to form a source/drain terminal and a data line, so as to form the thin-film transistor array.

In step (3), a transparent conductive layer is formed on the thin-film transistor array and the transparent conductive layer is subjected to a fourth photolithographic process according to a predetermined pattern in order to form the pixel electrode;

in step (4), plasma enhanced chemical vapor deposition is applied to deposit and form a protective film on the pixel electrode, the data line, and the thin-film transistor array and the protective film is subjected to a fifth photolithographic process according to a predetermined pattern in order to form the first passivation layer;

in step (5), a coating process is applied to form a black matrix of a predetermined thickness on the first passivation layer and the black matrix is subjected to a sixth photolithographic process; and in step (6), a transparent conductive layer is formed on the black matrix and the first passivation layer and the transparent conductive layer is subjected to a seventh photolithographic process according to a predetermined pattern in order to form the common electrode.

The first substrate is a glass substrate or a plastic substrate. The gate insulation layer has a thickness of 2000-5000 Å. The gate terminal has a thickness of 2000-5000 Å. The semiconductor layer has a thickness of 2000-4000 Å. The first passivation layer has a thickness of 100-6000 Å. The source/drain terminal has a thickness of 1000-6000 Å. The pixel electrode has a thickness of 100-1000 Å. The common electrode has a thickness of 100-1000 Å. The black matrix has a thickness of 0.2-1.0 um.

The present invention further provides a liquid crystal display panel, which comprises: a array substrate, a color filter substrate, and a liquid crystal material hermetically sealed between the array substrate and the color filter substrate. The array substrate comprises: a first substrate, a gate line formed on the first substrate, a data line formed on the first substrate, a thin-film transistor array formed on the first substrate, a pixel electrode formed on the thin-film transistor array, a first passivation layer formed on the pixel electrode, the data line, and the thin-film transistor array, a black matrix formed on the first passivation layer, and a common electrode formed on the black matrix and the first passivation layer. The color filter substrate comprises: a second substrate, a color filter formed on the second substrate, a second passivation layer formed on the color filter and the second substrate, and a spacer layer formed on the second passivation layer.

The thin-film transistor array comprises: a gate terminal formed on the first substrate, a gate insulation layer formed on the first substrate and the gate terminal, a semiconductor layer formed on the gate insulation layer, and a source/drain terminal formed on the semiconductor layer, the gate terminal being made of a metal of chromium, molybdenum, aluminum, or copper, the gate insulation layer being formed by depositing silicon through plasma enhanced chemical vapor deposition, the semiconductor layer being formed by depositing hydrogenated amorphous silicon;

the pixel electrode and the common electrode are each a transparent conductive layer, the pixel electrode and the common electrode being both made of indium tin oxide or indium zinc oxide, the first substrate being a glass substrate or a plastic substrate;

the gate insulation layer has a thickness of 2000-5000 Å, the gate terminal having a thickness of 2000-5000 Å, the semiconductor layer having a thickness of 2000-4000 Å, the first passivation layer having a thickness of 100-6000 Å, the source/drain terminal having a thickness of 1000-6000Å, the pixel electrode having a thickness of 100-1000 Å, the common electrode having a thickness of 100-1000 Å, the black matrix having a thickness of 0.2-1.0 um; and the second substrate is a glass substrate or plastic substrate, the color filter comprising: a red filter, a blue filter, and a green filter.

The efficacy of the present invention is that the present invention provides an array substrate and a manufacturing method thereof and a liquid crystal display panel using the array substrate, in which a black matrix is formed on the array substrate to increase the distance between a common electrode and a data line and a gate line in order to reduce a parasitic capacitance between the common electrode and the gate line and the data line to help enhance uniformity of voltage on the common electrode and improve the phenomena of being greenish and flickering of a screen image. Further, the manufacturing method of the array substrate is simple.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
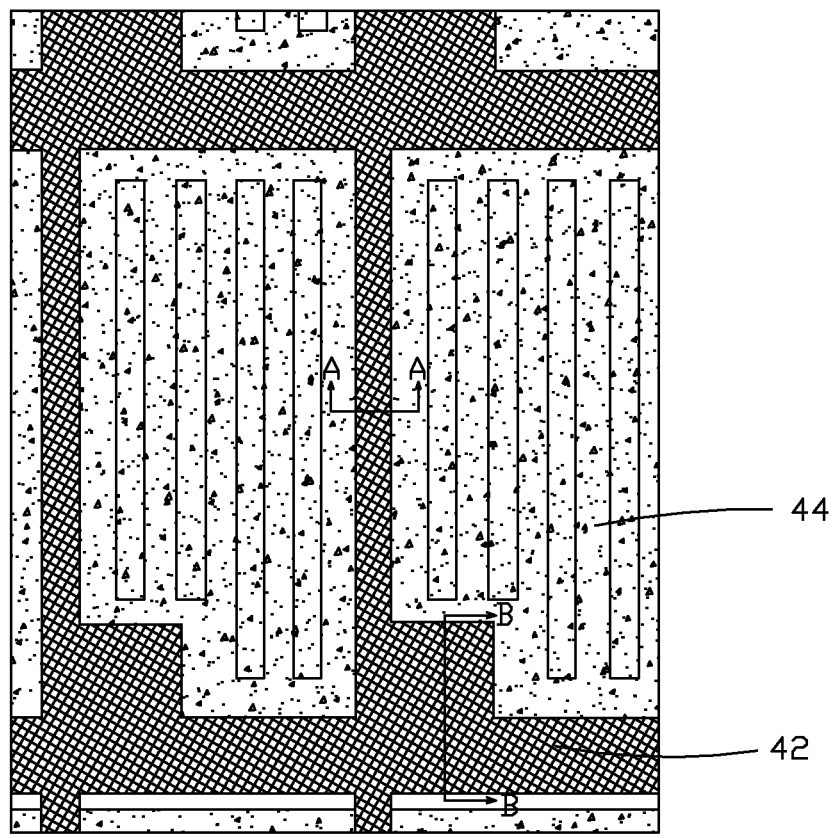
FIG. 1 is a top plan view showing of an array substrate according to the present invention.
Figure 2:
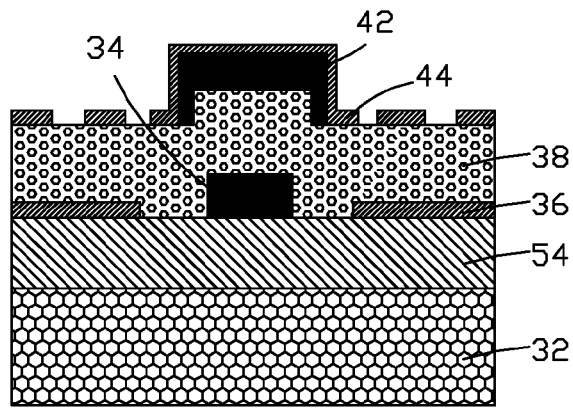
FIG. 2 is a cross-sectional view taken along line A-A of FIG. 1.
Figure 3:
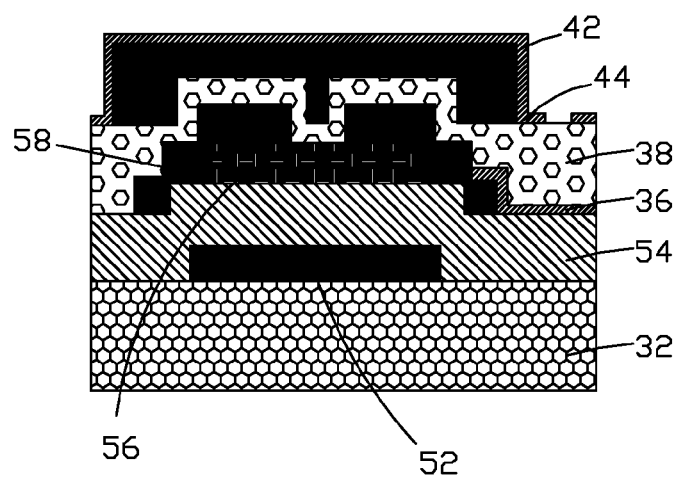
FIG. 3 is a cross-sectional view taken along line B-B of FIG. 1.
Figure 4:
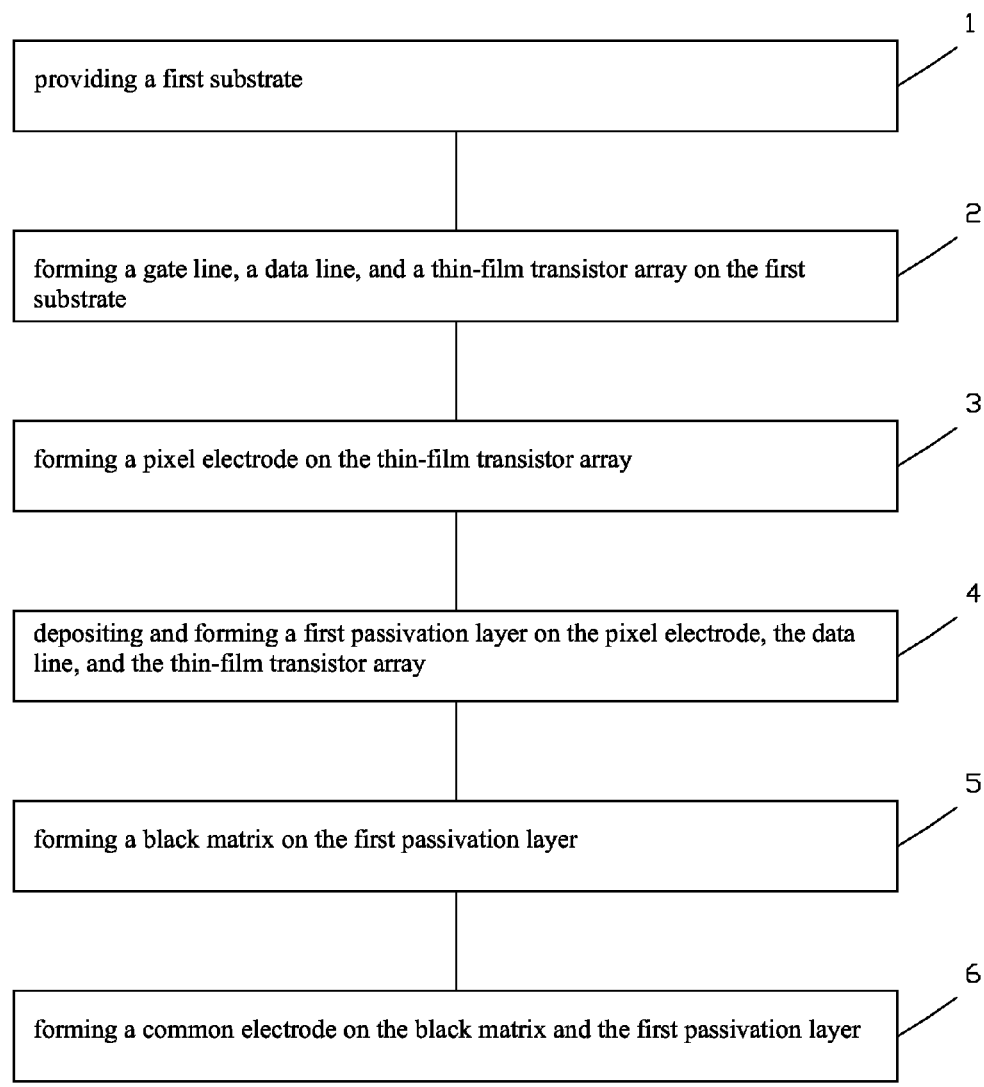
FIG. 4 is a flow chart illustrating a manufacturing method of an array substrate according to the present invention.
Figure 5:
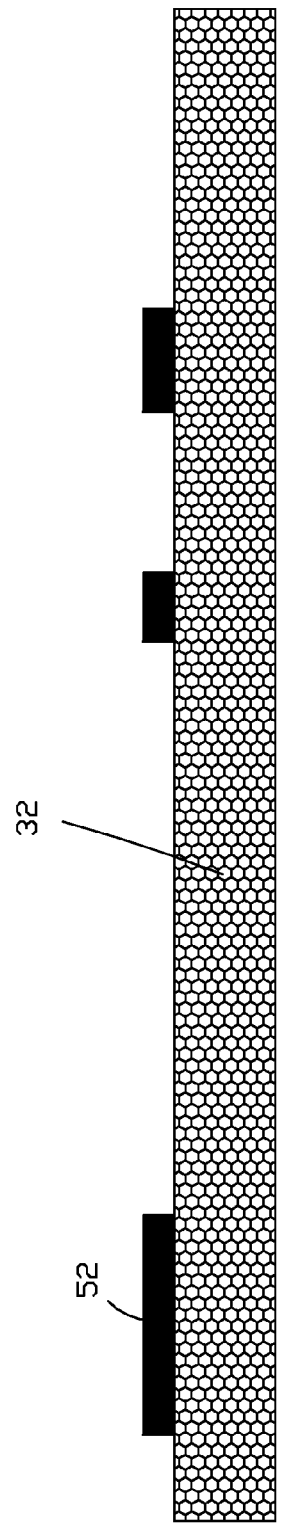
FIGS. 5-11 are schematic views illustrating the process of the manufacturing method of the array substrate according to the present invention.
Figure 6:
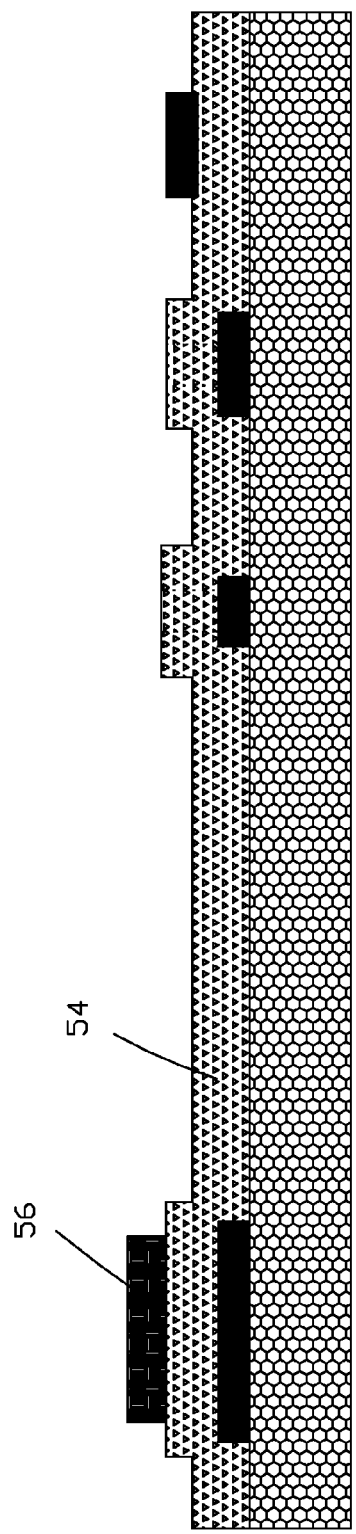
Figure 7:
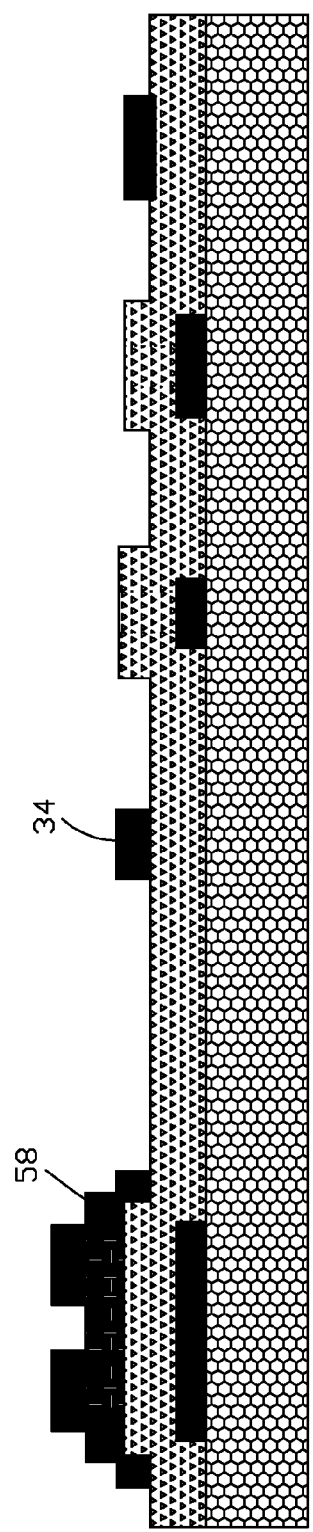
Figure 8:
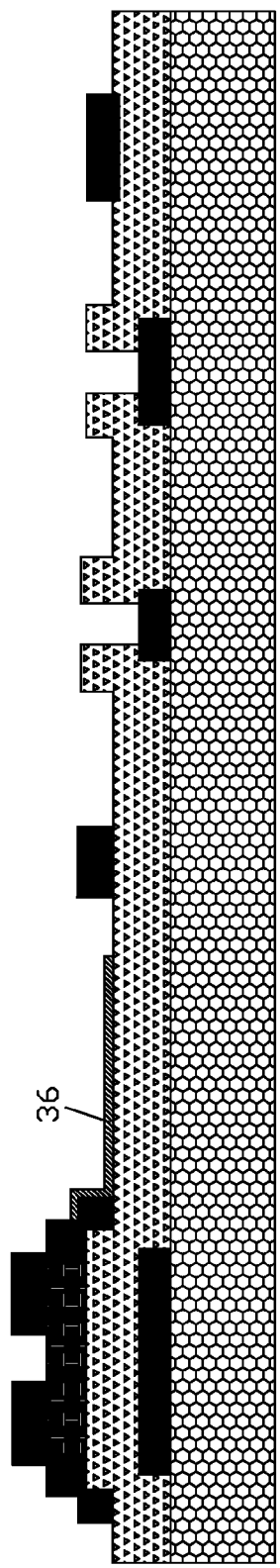
Figure 9:
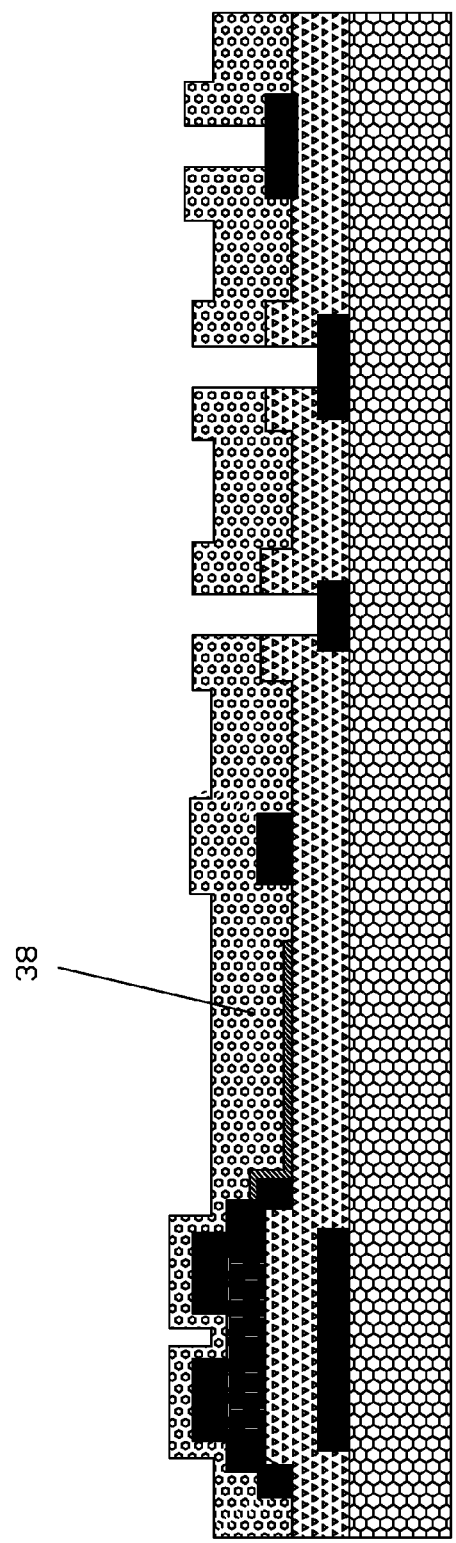
Figure 10:
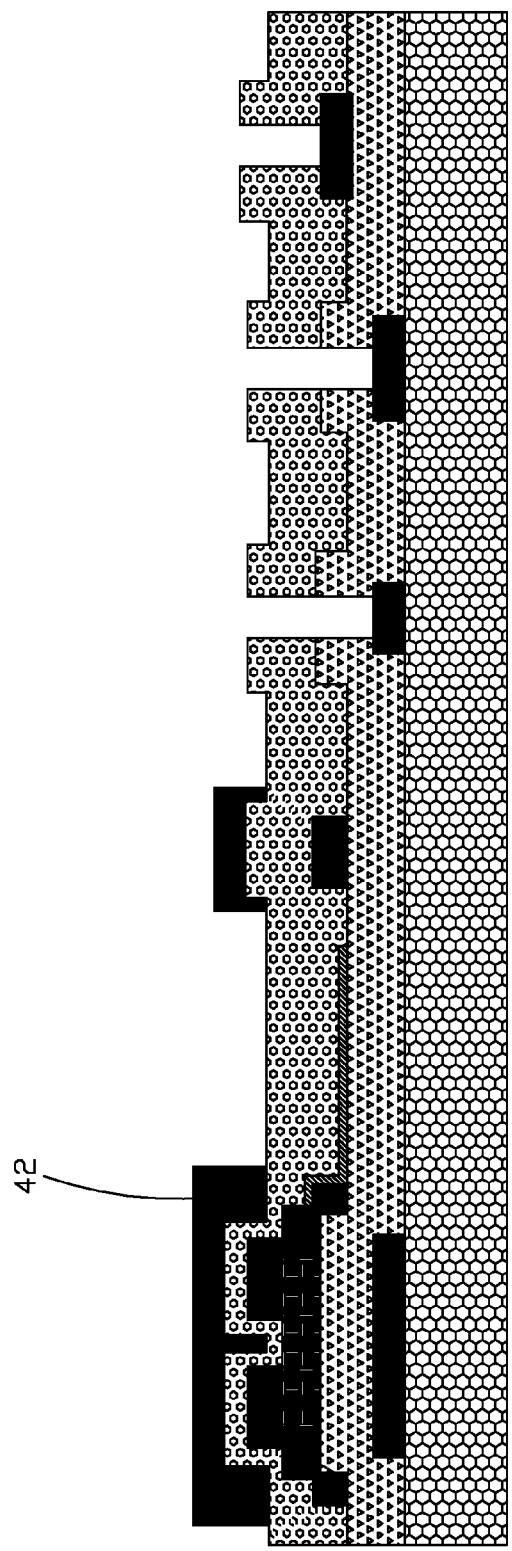
Figure 11:
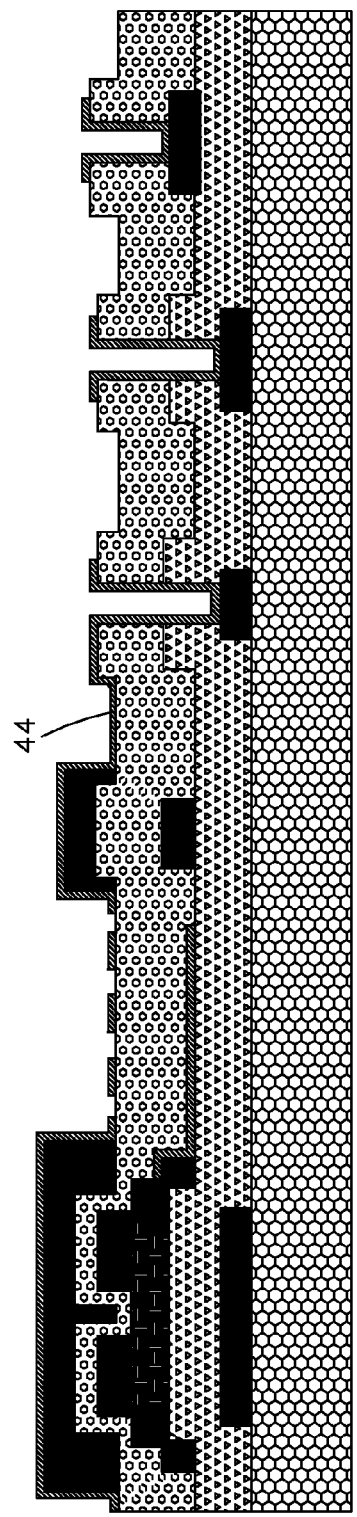

Referring to FIGS. 1-3, the present invention provides an array substrate. The array substrate is applicable to an FFS (Fringe Field Switching) display panel and comprises, specifically: a first substrate 32, a gate line (not shown) formed on the first substrate 32, a data line 34 formed on the first substrate 32, a thin-film transistor array (not labeled) formed on the first substrate 32, a pixel electrode 36 formed on the thin-film transistor array, a first passivation layer 38 formed on the pixel electrode 36, the data line 34, and the thin-film transistor array, a black matrix 42 formed on the first passivation layer 38, and a common electrode 44 formed on the black matrix 42 and the first passivation layer 38. The common electrode 44 is located above the data line 34 and the gate line and the black matrix 42 is arranged between the common electrode 44 and the data line 34 and the gate line to help increase the distance therebetween and thus reduce the parasitic capacitance between the common electrode 44 and the gate line and the data line 34 so as to help enhance uniformity of voltage on the common electrode 44.

Specifically, the thin-film transistor array comprises: a gate terminal 52 formed on the first substrate 32, a gate insulation layer 54 formed on the first substrate 32 and the gate terminal 52, a semiconductor layer 56 formed on the gate insulation layer 54, and a source/drain terminal 58 formed on the semiconductor layer 56. The gate terminal 52 has a thickness of 2000-5000 Å. The gate insulation layer 54 has a thickness of 2000-5000 Å. The gate terminal 52 is made of a metal of chromium (Cr), molybdenum (Mo), aluminum (Al), or copper (Cu). The gate insulation layer 54 is formed by depositing silicon (Si) through plasma enhanced chemical vapor deposition. The semiconductor layer 56 is formed by depositing hydrogenated amorphous silicon (a-Si:H).

The gate line is formed of a non-thin-film-transistor-array portion of a first metal layer. The data line 34 is formed of a non-thin-film-transistor-array portion of a second metal layer.

The pixel electrode 36 and the common electrode 44 are each a transparent conductive layer. In the instant embodiment, the pixel electrode 36 and the common electrode 44 are both made of indium tin oxide or indium zinc oxide. The first substrate 32 is a glass substrate or a plastic substrate and in the instant embodiment, is preferably a glass substrate.

In the instant embodiment, thicknesses of other film layers are specified as follows. The thickness of the first passivation layer 38 is 2000-5000 Å. The thickness of the semiconductor layer 56 is 100-6000 Å. The thickness of the source/drain terminal 58 is 1000-6000 Å. The thickness of the pixel electrode 36 is 100-1000 Å. The thickness of the common electrode 44 is 100-1000 Å. The thickness of the black matrix 42 is 0.2-1.0 μm.

Referring to FIGS. 4-11, the present invention also provides a manufacturing method of an array substrate, which comprises the following steps:

Step 1: providing a first substrate 32.

The first substrate 32 is a glass substrate or a plastic substrate and in the instant embodiment, is preferably a glass substrate.

Step 2: forming a gate line (not shown), a data line 34, and a thin-film transistor array (not labeled) on the first substrate 42.

This step can be further divided as the following steps:

Step 2.1: forming a first metal layer on the first substrate 42 and subjecting the first metal layer to a first photolithographic process according to a predetermined pattern to form a gate terminal 52 and the gate line.

Specifically, the first photolithographic process comprises steps including: coating, exposure, development, etching, and peeling, wherein etching is mask based wet etching.

The gate terminal 52 has a thickness of 2000-5000 Å.

Step 2.2: applying plasma enhanced chemical vapor deposition (PECVD) to deposit silicon on the first substrate 32 and the gate terminal 52 and the gate line to form a gate insulation layer 54.

The gate insulation layer has a thickness of 2000-4000 Å.

Step 2.3: applying plasma enhanced chemical vapor deposition to deposit hydrogenated amorphous silicon on the gate insulation layer 54 to form a semiconductor layer 56 and subjecting the semiconductor layer 56 to a second photolithographic process according to a predetermined pattern.

The second photolithographic process comprises steps including: coating, exposure, development, etching, and peeling, wherein etching is dry etching.

The semiconductor layer 56 has a thickness of 100-6000 Å.

Step 2.4: forming a second metal layer on the semiconductor layer 56 and the gate insulation layer 54 and subjecting the second metal layer to a third photolithographic process according to a predetermined pattern to form a source/drain terminal 58 and a data line 34, so as to form the thin-film transistor array.

The third photolithographic process comprises steps including: coating, exposure, development, etching, and peeling, wherein etching is wet etching.

The source/drain terminal 58 has a thickness of 1000-6000 Å.

Step 3: forming a pixel electrode 36 on the thin-film transistor array.

A transparent conductive layer is formed on the thin-film transistor array (the source/drain terminal 58 and the gate insulation layer 54) and the transparent conductive layer is subjected to a fourth photolithographic process according to a predetermined pattern in order to form the pixel electrode 36. The fourth photolithographic process comprises steps including: coating, exposure, development, etching, and peeling, wherein etching is mask based wet etching.

The pixel electrode 36 has a thickness of 100-1000 Å.

Step 4: depositing and forming a first passivation layer 38 on the pixel electrode 36, the data line 34, and the thin-film transistor array.

Plasma enhanced chemical vapor deposition is applied to deposit and form a protective film on the pixel electrode 36, the data line 34, and the thin-film transistor array and the protective film is subjected to a fifth photolithographic process according to a predetermined pattern in order to form the first passivation layer 38. The fifth photolithographic process comprises steps including: coating, exposure, development, etching, and peeling, wherein etching is dry etching or wet etching.

The first passivation layer 38 has a thickness of 2000-5000 Å.

Step 5: forming a black matrix 42 on the first passivation layer 38.

A coating process is applied to form a black matrix 42 of a predetermined thickness on the first passivation layer 38 and the black matrix 42 is subjected to a sixth photolithographic process. The black matrix 42 has a thickness of 0.2-1.0 μm.

Step 6: forming a common electrode 44 on the black matrix 42 and the first passivation layer 38.

A transparent conductive layer is formed on the black matrix 42 and the first passivation layer 38 and the transparent conductive layer is subjected to a seventh photolithographic process according to a predetermined pattern in order to form the common electrode 44. The common electrode 44 has a thickness of 100-1000 Å.

Figure 12:
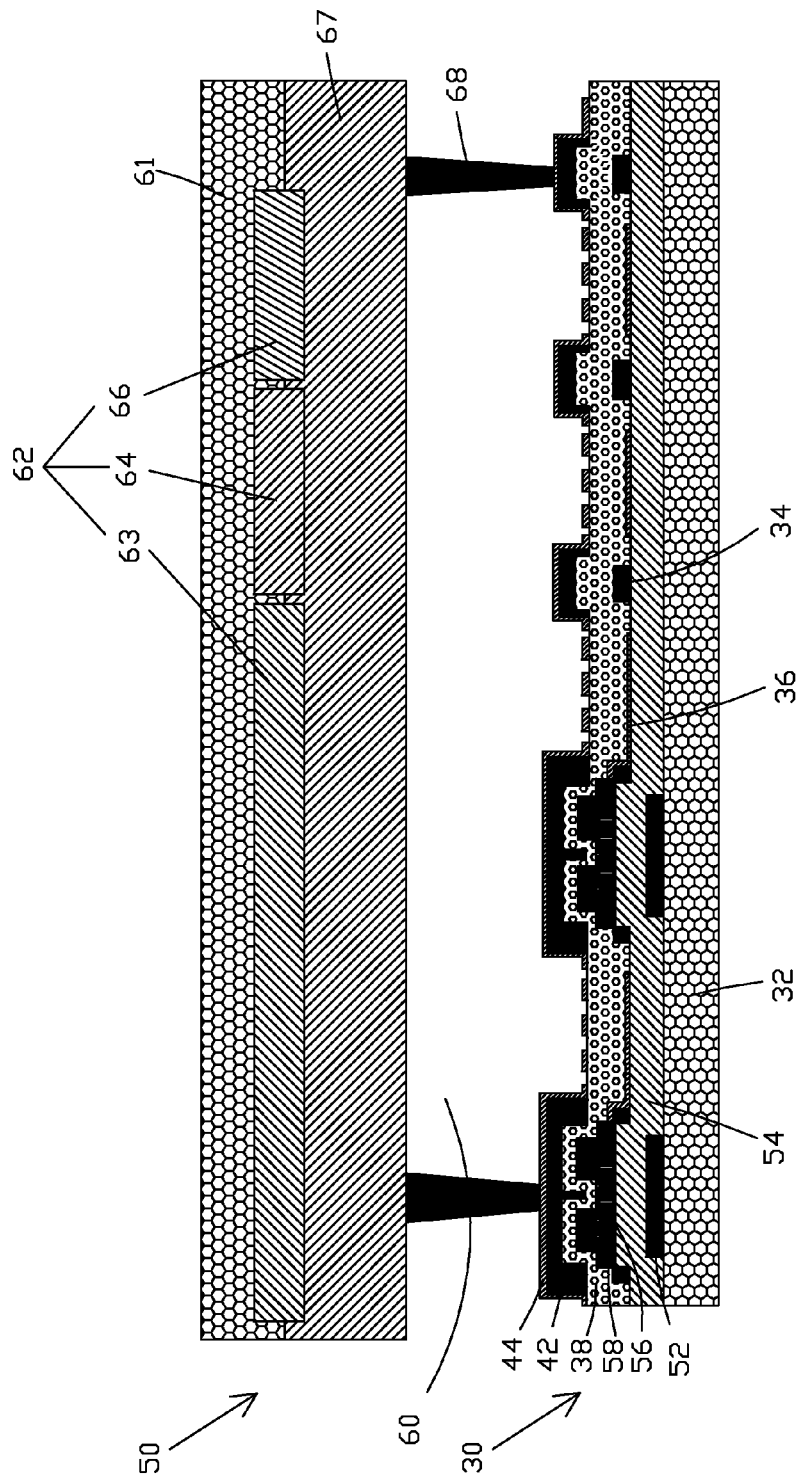
FIG. 12 is a schematic view illustrating the structure of a liquid crystal display panel according to the present invention.

Referring to FIG. 12, the present invention further provides a liquid crystal display panel. The liquid crystal display panel is an FFS display panel and comprises, specifically: an array substrate 30, a color filter substrate 50, and a liquid crystal material 60 hermetically sealed between the array substrate 30 and the color filter substrate 50. The array substrate 30 comprises: a first substrate 32, a gate line (not shown) formed on the first substrate 32, a data line 34 formed on the first substrate 32, a thin-film transistor array (not labeled) formed on the first substrate 32, a pixel electrode 36 formed on the thin-film transistor array, a first passivation layer 38 formed on the pixel electrode 36, the data line 34, and the thin-film transistor array, a black matrix 42 formed on the first passivation layer 38, and a common electrode 44 formed on the black matrix 42 and the first passivation layer 38. The color filter substrate 50 comprises: a second substrate 61, a color filter 62 formed on the second substrate 61, a second passivation layer 67 formed on the color filter 62 and the second substrate 61, and a spacer layer 68 formed on the second passivation layer 67. The common electrode 44 is located above the data line 34 and the gate line and the black matrix 42 is arranged between the common electrode 44 and the data line 34 and the gate line to help increase the distance therebetween and thus reduce the parasitic capacitance between the common electrode 44 and the gate line and the data line 34 so as to help enhance uniformity of voltage on the common electrode 44.

Specifically, the thin-film transistor array comprises: a gate terminal 52 formed on the first substrate 32, a gate insulation layer 54 formed on the first substrate 32 and the gate terminal 52, a semiconductor layer 56 formed on the gate insulation layer 54, and a source/drain terminal 58 formed on the semiconductor layer 56. The gate terminal 52 has a thickness of 2000-5000 Å. The gate insulation layer 54 has a thickness of 2000-5000 Å. The gate terminal 52 is made of a metal of chromium, molybdenum, aluminum, or copper. The gate insulation layer 54 is formed by depositing silicon through plasma enhanced chemical vapor deposition. The semiconductor layer 56 is formed by depositing hydrogenated amorphous silicon.

The gate line is formed of a non-thin-film-transistor-array portion of the first metal layer. The data line 34 is formed of a non-thin-film-transistor-array portion of the second metal layer.

The pixel electrode 36 and the common electrode 44 are each a transparent conductive layer. In the instant embodiment, the pixel electrode 36 and the common electrode 44 are both made of indium tin oxide or indium zinc oxide. The first substrate 32 is a glass substrate or a plastic substrate and in the instant embodiment, is preferably a glass substrate.

In the instant embodiment, thicknesses of other film layers are specified as follows. The thickness of the first passivation layer 38 is 2000-5000 Å. The thickness of the semiconductor layer 56 is 100-6000 Å. The thickness of the source/drain terminal 58 is 1000-6000 Å. The thickness of the pixel electrode 36 is 100-1000 Å. The thickness of the common electrode 44 is 100-1000 Å. The thickness of the black matrix 42 is 0.2-1.0 μm.

The second substrate 61 is a glass substrate or a plastic substrate. The color filter 62 comprises: a red filter 63, a blue filter 64, and a green filter 66.

In summary, the present invention provides an array substrate and a manufacturing method thereof and a liquid crystal display panel using the array substrate, in which a black matrix is formed on the array substrate to increase the distance between a common electrode and a data line and a gate line in order to reduce a parasitic capacitance between the common electrode and the gate line and the data line to help enhance uniformity of voltage on the common electrode and improve the phenomena of being greenish and flickering of a screen image. Further, the manufacturing method of the array substrate is simple.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An array substrate, comprising: a first substrate, a gate line formed on the first substrate, a data line formed on the first substrate, a thin-film transistor array formed on the first substrate, a pixel electrode formed on the thin-film transistor array, a first passivation layer formed on the pixel electrode, the data line, and the thin-film transistor array, a black matrix formed on the first passivation layer and having a size covering completely at least the data line, and a common electrode formed on the black matrix and the first passivation layer such that a portion of the common electrode corresponding exactly to at least the data line is completely spaced from the data line by the black matrix and the first passivation layer.

2. The array substrate as claimed in claim 1, wherein the thin-film transistor array comprises: a gate terminal formed on the first substrate, a gate insulation layer formed on the first substrate and the gate terminal, a semiconductor layer formed on the gate insulation layer, and a source/drain terminal formed on the semiconductor layer, the gate terminal being made of a metal of chromium, molybdenum, aluminum, or copper, the gate insulation layer being formed by depositing silicon through plasma enhanced chemical vapor deposition, the semiconductor layer being formed by depositing hydrogenated amorphous silicon.

3. The array substrate as claimed in claim 1, wherein the pixel electrode and the common electrode are each a transparent conductive layer, the pixel electrode and the common electrode being both made of indium tin oxide or indium zinc oxide, the first substrate being a glass substrate or a plastic substrate.

4. The array substrate as claimed in claim 2, wherein the gate insulation layer has a thickness of 2000-5000 Å, the gate terminal having a thickness of 2000-5000 Å, the semiconductor layer having a thickness of 2000-4000 Å, the first passivation layer having a thickness of 100-6000 Å, the source/drain terminal having a thickness of 1000-6000 Å, the pixel electrode having a thickness of 100-1000 Å, the common electrode having a thickness of 100-1000 Å, the black matrix having a thickness of 0.2-1.0 um.

5. A liquid crystal display panel, comprising: a array substrate, a color filter substrate, and a liquid crystal material hermetically sealed between the array substrate and the color filter substrate, the array substrate comprising: a first substrate, a gate line formed on the first substrate, a data line formed on the first substrate, a thin-film transistor array formed on the first substrate, a pixel electrode formed on the thin-film transistor array, a first passivation layer formed on the pixel electrode, the data line, and the thin-film transistor array, a black matrix formed on the first passivation layer and having a size covering completely at least the data line, and a common electrode formed on the black matrix and the first passivation layer such that a portion of the common electrode corresponding exactly to at least the data line is completely spaced from the data line by the black matrix and the first passivation layer, the color filter substrate comprising: a second substrate, a color filter formed on the second substrate, a second passivation layer formed on the color filter and the second substrate, and a spacer layer formed on the second passivation layer.

6. The liquid crystal display panel as claimed in claim 5, wherein the thin-film transistor array comprises: a gate terminal formed on the first substrate, a gate insulation layer formed on the first substrate and the gate terminal, a semiconductor layer formed on the gate insulation layer, and a source/drain terminal formed on the semiconductor layer, the gate terminal being made of a metal of chromium, molybdenum, aluminum, or copper, the gate insulation layer being formed by depositing silicon through plasma enhanced chemical vapor deposition, the semiconductor layer being formed by depositing hydrogenated amorphous silicon;

the pixel electrode and the common electrode are each a transparent conductive layer, the pixel electrode and the common electrode being both made of indium tin oxide or indium zinc oxide, the first substrate being a glass substrate or a plastic substrate;

the gate insulation layer has a thickness of 2000-5000 Å, the gate terminal having a thickness of 2000-5000 Å, the semiconductor layer having a thickness of 2000-4000 Å, the first passivation layer having a thickness of 100-6000 Å, the source/drain terminal having a thickness of 1000-6000 Å, the pixel electrode having a thickness of 100-1000 Å, the common electrode having a thickness of 100-1000 Å, the black matrix having a thickness of 0.2-1.0 um; and the second substrate is a glass substrate or plastic substrate, the color filter comprising: a red filter, a blue filter, and a green filter.

* * * * *